(12) United States Patent
Ueno

(10) Patent No.: US 7,563,696 B2
(45) Date of Patent: Jul. 21, 2009

(54) SEMICONDUCTOR DEVICE MANUFACTURING APPARATUS AND SEMICONDUCTOR DEVICE MANUFACTURING METHOD

(75) Inventor: Kazuyoshi Ueno, Tokyo (JP)

(73) Assignee: NEC Electronics Corporation (JP)

(*) Notice: Subject to any disclaimer, the term of this patent is extended or adjusted under 35 U.S.C. 154(b) by 32 days.

(21) Appl. No.: 11/690,089

(22) Filed: Mar. 22, 2007

(65) Prior Publication Data

US 2007/0161128 A1    Jul. 12, 2007

Related U.S. Application Data

(62) Division of application No. 10/626,233, filed on Jul. 24, 2003, now Pat. No. 7,220,318, which is a division of application No. 09/273,627, filed on Mar. 23, 1999, now Pat. No. 6,670,270.

(30) Foreign Application Priority Data

Mar. 24, 1998    (JP) .............................. 1998-75195

(51) Int. Cl.
    *H01L 21/326*    (2006.01)
(52) U.S. Cl. ...................................... 438/466; 438/584
(58) Field of Classification Search .................... None
    See application file for complete search history.

(56) References Cited

U.S. PATENT DOCUMENTS

| 4,926,791 | A | * | 5/1990  | Hirose et al. ......... 118/723 MA |
| 4,963,239 | A |   | 10/1990 | Shimamura et al. .... 204/192.12 |
| 5,000,113 | A |   | 3/1991  | Wang et al. .............. 118/723 E |
| 5,099,790 | A | * | 3/1992  | Kawakami ........... 118/723 MR |
| 5,169,676 | A | * | 12/1992 | Moran et al. ................ 427/575 |
| 5,203,959 | A | * | 4/1993  | Hirose et al. .................. 216/70 |
| 5,397,428 | A |   | 3/1995  | Stoner et al. ................... 117/86 |
| 5,487,786 | A | * | 1/1996  | Chida et al. ............... 118/723 E |
| 5,626,679 | A | * | 5/1997  | Shimizu et al. ....... 118/723 MR |
| 5,695,810 | A |   | 12/1997 | Dubin et al. ................... 427/96 |
| 5,776,254 | A |   | 7/1998  | Yuuki et al. ................. 118/725 |
| 5,917,980 | A |   | 6/1999  | Yoshimura et al. .......... 385/129 |
| 5,958,510 | A |   | 9/1999  | Sivaramakrishnam et al. .... 427/255.6 |
| 6,037,001 | A |   | 3/2000  | Kaloyeros et al. ........... 427/250 |
| 6,051,285 | A |   | 4/2000  | Kin ............................. 427/569 |

(Continued)

FOREIGN PATENT DOCUMENTS

JP    119467    4/1989

(Continued)

OTHER PUBLICATIONS

JP 57-39431 Publication of Japanese Laid Open Patent IPC 7th Edition, date unknown.

*Primary Examiner*—David E Graybill
(74) *Attorney, Agent, or Firm*—Hayes Soloway P.C.

(57) ABSTRACT

A semiconductor device manufacturing apparatus which uses a thermal CVD reaction to deposit a film onto a substrate has a ring with an electrode terminal that makes contact with either the substrate or the deposited film thereon, a power supply that applies a current or a potential to this electrode terminal of the ring, and a piston cylinder mechanism for moving the ring up and down, so as to cause its electrode terminal to make and break contact with the substrate or deposited film thereon.

9 Claims, 8 Drawing Sheets

U.S. PATENT DOCUMENTS

| | | | |
|---|---|---|---|
| 6,072,313 A * | 6/2000 | Li et al. | 324/230 |
| 6,077,571 A | 6/2000 | Kaloyeros et al. | 427/576 |
| 6,136,725 A | 10/2000 | Loan et al. | 438/758 |
| 6,362,115 B1 | 3/2002 | Mandal | 438/780 |
| 6,670,270 B1 | 12/2003 | Ueno | 438/687 |
| 2007/0161128 A1 * | 7/2007 | Ueno | 438/5 |

FOREIGN PATENT DOCUMENTS

| | | |
|---|---|---|
| JP | 2119125 | 5/1990 |
| JP | 3-8333 | 1/1991 |
| JP | 397871 | 4/1991 |
| JP | 3257099 | 11/1991 |
| JP | 4-320325 | 11/1992 |
| JP | 6-283440 | 10/1994 |
| JP | 9-223672 | 8/1997 |

* cited by examiner

20 : POSITIVE ELECTRODE TERMINAL
21 : NEGATIVE ELECTRODE TERMINAL

30 : ELECTRODE TERMINAL

SEMICONDUCTOR DEVICE MANUFACTURING APPARATUS AND SEMICONDUCTOR DEVICE MANUFACTURING METHOD

CROSS-REFERENCE TO RELATED APPLICATION

This Application is a divisional of U.S. application Ser. No. 10/626,233, filed Jul. 24, 2003 now U.S. Pat No. 7,220,318, which in turn is a divisional of U.S. application Ser. No. 09/273,627, filed Mar. 23, 1999, now U.S. Pat. No. 6,670,270.

BACKGROUND OF THE INVENTION

1. Field of the Invention

The present invention relates to an apparatus for manufacturing and a method for manufacturing a semiconductor device, and more particularly to a semiconductor device manufacturing apparatus and method for the purpose of forming, using a thermal CVD (chemical vapor deposition) method to form on a substrate a metallic film such as a film of copper or aluminum, a high dielectric coefficient layer such as a layer of titanium oxide strontium, and a ferroelectric film such as BST or TZT.

2. Description of the Related Art

In general, in fabricating a wire (a so-called damascene copper wire) by burying copper in a trench of a wiring pattern, a thermal CYD apparatus is used to deposit copper onto the substrate. FIG. 6 shows a general view of a thermal CVD apparatus in the past.

As shown in FIG. 9, a thermal CVD apparatus in the past has a hollow vacuum chamber 60, a vacuum pump 61 such as a turbomolecular pump for the purpose of exhausting the inside of the vacuum chamber 60 to a vacuum condition, a substrate holder 62, provided within the vacuum chamber 60, which holds a substrate W, a vaporizer 63 which atomizes the copper to be deposited on the substrate W as the raw gas, and a feed port 64 for the purpose of supplying the raw gas from the vaporizer 63 to within the vacuum chamber 60.

The substrate holder 62 has a substrate heating mechanism which is capable of controlling the temperature of the substrate W to within the range from 100° C. to 400° C. When depositing copper, the temperature is controlled to approximately 200° C.

Next, the method of depositing a copper film for the purpose of forming a copper wire using a thermal CVD apparatus of the past will be described. First, a trench is formed in the region in which a wire is to be formed on the silicon oxide film of the semiconductor substrate W.

Next, the above-noted substrate W is supported on top of the substrate holder 62 of the thermal CVD apparatus. The inside of the vacuum chamber 60 is brought to a vacuum condition beforehand by the vacuum pump 61.

Next, the substrate heating mechanism of the substrate holder 62 is caused to operate, so as to heat the substrate to a prescribed temperature. Simultaneously with this action, the Cu(hfac) (tmvs) raw gas, which has been vaporized by the vaporizer 63 is supplied to the supply port 64, together with a hydrogen carrier gas, and a copper film of a prescribed thickness is deposited onto the substrate W.

Then, using a CMP (chemical mechanical polishing) method, the deposited copper film is polished, so that copper remains only within the trench, thereby forming the copper wire.

In the Japanese Examined Patent Publication(KOKOKU) No. 1-19467 and the Japanese Unexamined Patent Publication (KOKAI)No. 2-119125 and in the Japanese Unexamined Patent Publications (KOKAI) Nos. 3-97871 and 3-257099, there is technology disclosed directed to the application of a voltage to a substrate holder that holds a substrate in a plasma CVD apparatus.

The major reaction of the above-described copper deposition reaction is chiefly the disproportionate reaction

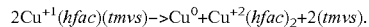

$$2Cu^{+1}(hfac)(tmvs) \rightarrow Cu^0 + Cu^{+2}(hfac)_2 + 2(tmvs).$$

The rate of this reaction is established by the absorption of the 2 $Cu^{+1}$ (hfac) molecules at the deposition surface and the movement of charge and removal of reaction products.

The driving forces of these rate-determining reactions are such things as the thermal energy according to the temperature of the substrate surface, and the amount of raw gas that is supplied, and it is difficult to improve the rate of reaction by means of these quantities.

The above-noted disproportionate reaction is, in principle, a reversible reaction, and it is thought that there is a limit to the control of the direction of the reaction by means of isotropic heat.

In formation of a copper wire using a thermal CVD apparatus of the past, in order to improve coverage it was necessary to lower the substrate temperature, which causes the rate of copper deposition to become slow (for example, 20 nm/minute). As a result, the time for fabrication of the semiconductor device becomes long, this resulting in a drop in productivity.

In the method of the past, because it was not possible to control the crystal orientation in the film that was formed, it was difficult to deposit a film having good quality with polarity alignment.

Additionally, in order to improve the reliability of the copper wires, it is necessary to control the grain growth in the copper film. With the method of the past, however, it was difficult to control grain growth.

In the plasma CVD apparatus technology that was disclosed in the above-noted Japanese Patent Publications, a bias voltage is applied to the substrate, and ions such as argon are allowed to collide with the surface of the substrate, the purpose being to impure the film surface purity and step coverage, and improve the flatness of the film surface, this being intrinsically different from the technology of the present invention, which uses an electrostatic action or the action of an electrical current.

Accordingly, it is an object of the present invention to solve the problems noted above, and to provide an apparatus and method for manufacturing a semiconductor device, whereby it is possible to promote the deposition of a film and to control the rate of film deposition, the crystal orientation, and the growth of grains.

SUMMARY OF THE INVENTION

In order to achieve the above-noted object, the present invention has the following described technical constitution.

Note that, one aspect of the present invention is that an apparatus for manufacturing a semiconductor device which has a basic technical conception in that a semiconductor device manufacturing apparatus that uses a thermal CVD reaction to deposit a film onto a substrate, the apparatus having a power supply means that supplies electric current to the substrate or the film deposited thereupon.

And a second aspect of the present invention is that a semiconductor device manufacturing method for depositing a film on a substrate by a thermal CVD reaction, wherein the film is deposited on a substrate while a current is applied to the substrate or film deposited thereupon.

Specifically, an apparatus for manufacturing a semiconductor device according to the present invention is a semiconductor device manufacturing apparatus which uses a thermal CVD reaction to deposit a film onto a substrate, and which has a power supply that either applies a current or a potential to a substrate or to a film that is deposited onto the substrate.

An apparatus for manufacturing a semiconductor device according to the present invention is a semiconductor device manufacturing apparatus which uses a thermal CVD reaction to deposit a film onto a substrate, this apparatus having a supporting means on which the electrode terminal units are supported, comprising, for example, a rectangular or a ring like frame as well as a plate having for example, a rectangular or a ring like aperture therein, and which has an electrode terminal that makes contact with the substrate or with film that is deposited onto the substrate, a power supply that applies either a current or a potential to the electrode terminal of the ring, and means for moving the ring so that it makes contact with or is removed from the substrate or with film that is deposited onto the substrate.

The above-noted electrode unit supporting means such as the ring, can have a positive electrode terminal units to which a positive voltage is applied and a negative electrode terminal to which a negative voltage is applied, these being disposed in opposition to each other.

A plurality of the above-noted electrode terminal units can be disposed in opposition on a circle that is concentric to the supporting means, for example, the ring, the power supply applying a voltage to each electrode terminal unit, independently, a positive voltage being applied to one and a negative voltage being applied to the other of the opposing electrode terminal units, and it also being possible to sequentially switch the positive and negative voltages that are applied to adjacent electrode terminal units.

A semiconductor device manufacturing apparatus according to the present invention can also have means for monitoring the potential of the substrate or a film that is deposited thereupon, and for controlling the current or voltage or the temperature of the substrate, based on that potential.

A semiconductor device manufacturing apparatus according to the present invention preferably enables the setting of the potential of the substrate or a film that is deposited thereupon to, for example, an arbitrary ground potential or the like.

Another semiconductor device manufacturing apparatus according to the present invention is a semiconductor device manufacturing apparatus that uses a thermal CVD reaction to deposit a film onto a substrate, this apparatus having means for generating a current or a potential in the substrate or a film that is deposited thereupon, without coming into contact with the substrate or a film that is deposited thereupon.

The above-noted generating means is, for example, a magnetic generating means that applies magnetic flux to the substrate or to a film that is deposited thereupon.

A method of manufacturing a semiconductor device according to the present invention is a semiconductor device manufacturing method whereby a thermal CVD reaction is used to deposit a film onto a substrate, whereby the film is deposited as a current or a potential is applied to the substrate or to a film that is deposited thereupon.

A method of manufacturing a semiconductor device according to the present invention is additionally one in which a thermal CVD reaction is used to deposit a film onto a substrate, whereby the film is deposited as the potential of the substrate or a film deposited thereupon is set to an arbitrary ground potential.

Yet another method of manufacturing a semiconductor device according to the present invention is one in which a thermal CVD reaction is used to deposit a film onto a substrate, whereby, for example, magnetic flux are applied so as to apply a current or a potential to the substrate or a film deposited thereupon, without making contact with the substrate or the film deposited thereupon.

Yet another method of manufacturing a semiconductor device according to the present invention has:

(1) a step of depositing a film onto a substrate using a thermal CVD reaction and (2) a step of depositing a film by using a thermal CVD reaction as a current or potential is applied to the deposited film.

Yet another method of manufacturing a semiconductor device according to the present invention has:

(1) a step of forming a trench on a semiconductor substrate, (2) a step of depositing a barrier layer for the purpose of preventing film diffusion within the trench, (3) a step of depositing a film onto the barrier layer by using a thermal CVD reaction, (4) a step of depositing a film by using a thermal CVD reaction while applying a current or a potential to the deposited film, and (5) a step of polishing the film and the barrier layer, so as to leave the film and barrier layer within the trench so as to form a wire.

According to the present invention, by applying a current or a potential to a substrate or a film that is deposited thereupon, in addition to a disproportionate reaction, a reduction reaction occurs, the deposition of the film is promoted, and it is possible to control the film deposition rate, the crystal orientation, and the grain growth.

Additionally, because the present invention can be used to set the potential of the substrate or a film that is deposited thereupon to, for example, ground potential, it is possible to obtain a uniform potential distribution generated on the surface thereof because of electrostatic chucking, for example.

DESCRIPTION OF THE PREFERRED EMBODIMENTS

Figure 1:
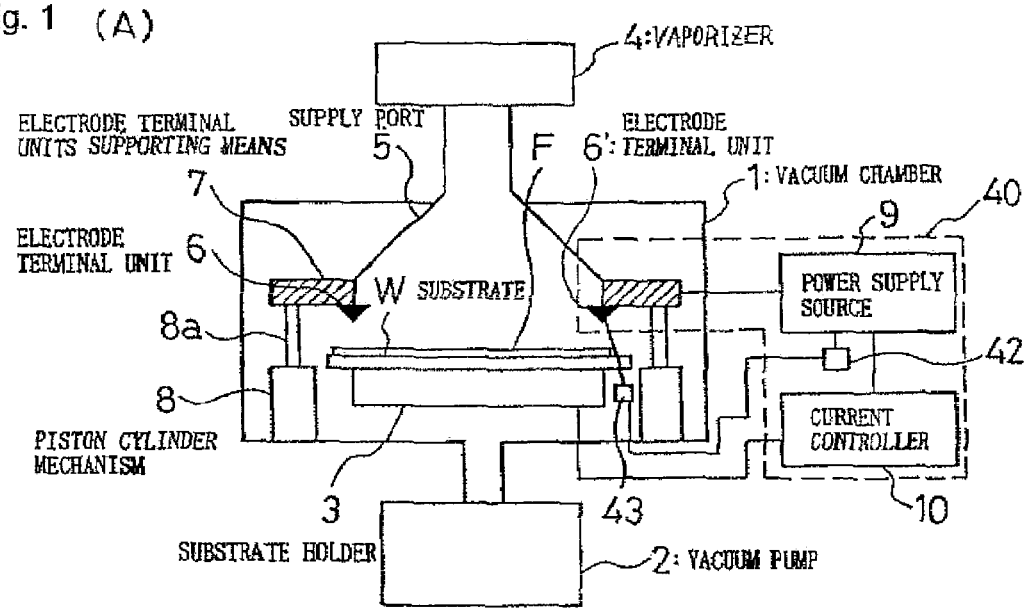
FIGS. 1(A) and 1(B) are drawings that illustrate in simplified form a semiconductor device manufacturing apparatus according to the first embodiment of the present invention, with FIG. 1(A) showing the condition in which the electrode terminal of the ring is removed from the surface of the substrate and FIG. 1(B) showing the condition in which the electrode terminal of the ring is in contact with the substrate surface.
Figure 1:
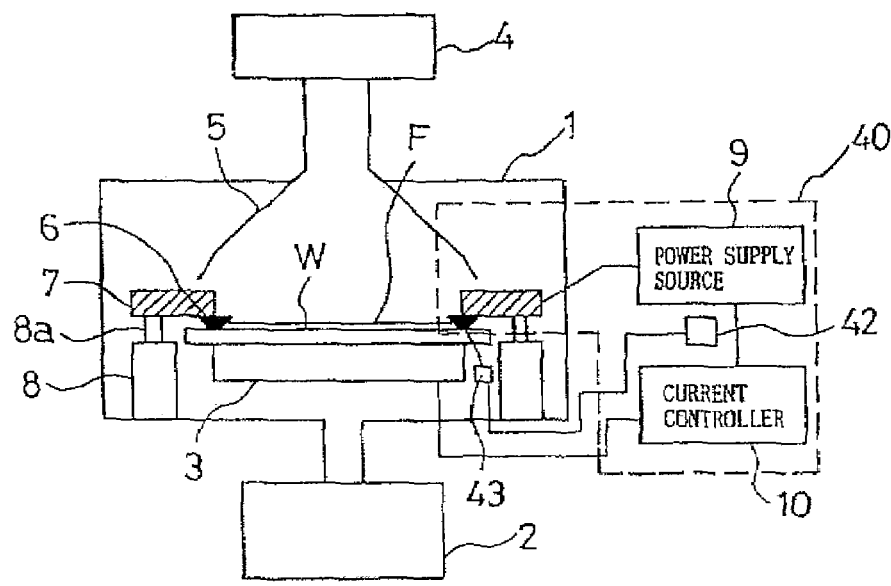

Embodiments of the present invention are described in detail below, with references being made to relevant accompanying drawings.

FIGS. 1(A) and 1(B) are drawings that illustrate in simplified form the basic construction of a semiconductor device manufacturing apparatus according to the present invention, in that the apparatus 100 having a power supply means 40 that supplies electric current to the substrate W or the film F deposited thereupon.

In the semiconductor device manufacturing apparatus 100 of the present invention, the power supply means 40 supplies the electric current to the substrate W or the film F deposited thereupon, either directly or indirectly.

The semiconductor device manufacturing apparatus 100 of the present invention, has the power supply means 40 which comprises a power supply source 9 and an electrode terminal unit 6 which is connected to the power supply source 9 and to the substrate W or the film F deposited thereupon.

In the present invention, the power supply means 40 further comprises a current controlling means 10 which controls the current to be supplied to the substrate W or the film F deposited thereupon.

In the present invention, the current controlling means 10 can control the current to be supplied to the substrate W or the film F deposited thereupon, either continuously or intermittently.

In the present invention, the electrode terminal units 6 may be provided on peripheral area of either the substrate W or a region on which the film F is being deposited on the substrate W.

Further in the present invention, the electrode terminal units 6 may comprise a plurality of pairs of two electrode terminal units 6, and each one of the pairs comprising two electrode terminal units 6, a first electrode terminal unit 6 and a second electrode terminal unit 6 which being oppositely arranged with interposing an area of the substrate W on which the film F will be deposited, therebetween.

In the present invention, the current controlling means 10 supplies a voltage to each one of the electrode terminals pair so as to supply a voltage having a first polarity to the first electrode terminal unit of respective electrode terminal pairs and to supply a voltage having a second polarity to the second electrode terminal unit of the electrode terminal pair, oppositely arranged to the first electrode terminal unit.

Further in the present invention, the current controlling means 10 controls the polarity of the voltage applied to each one of the electrode terminal units 6 of the respective electrode terminal pairs so as to be varied either continuously or intermittently with respect to the time elapsing.

In the semiconductor device manufacturing apparatus 100 of the present invention, the current controlling means 10 can control the polarity of the voltage applied to each one of the electrode terminal units 6 of the respective electrode terminal pairs so that the polarity of the voltage applied to one of the electrode terminal units in the respective pairs differs from that applied to separate electrode terminal pair adjacently arranged thereto, either continuously or intermittently with respect to the time elapsing.

The current controlling means 10 may control the voltage applied to at least one of the electrode terminal units 6 so as to change the voltage value, either continuously or intermittently with respect to the time elapsing.

On the other hand, the current controlling means 10 also may control the polarity of the voltage applied to each one of the electrode terminal units 6 so as to change a direction of the current flowed through the substrate W.

The current controlling means 10 further may include a detecting means 43 for detecting either one of current and voltage applied to the substrate W or the film F deposited thereupon whereby the current controlling means 10 may control the value of either the current or the voltage in response to a result of the detecting means 43.

While, the apparatus 100 of the present invention, it is further provided with a temperature controlling means 42 for controlling the temperature of the electrode terminal units 6 and wherein the current controlling means 10 may further include a detecting means 43 for detecting either one of current and voltage applied to the substrate W or the film F deposited thereupon whereby the temperature controlling means 42 controls a temperature of the substrate W and/or a film F deposited on the substrate so as to change a temperature of the substrate or the film deposited thereupon, in response to a result of the detecting means.

The semiconductor device manufacturing apparatus 100 of the present invention, the power supply means 40 is further provided with an electrode terminal units moving means 7 which supports the plurality of electrode terminal units 6, changes a respective position of the electrode terminal unit 6 with respect to a main surface of the substrate W or the film F deposited thereupon.

The semiconductor device manufacturing apparatus 100 of the present invention, the electrode terminal units moving means 7, i.e., a supporting means for supporting the electrode terminal units, may control to set the electrode terminal units 6 either at a first position at which the electrode terminal units are contacted to the substrate or the film deposited thereupon or at a second position at which the electrode terminal units are not contacted thereto.

Next, a first embodiment of the present invention will be explained hereunder with referring to FIGS. 1(A) and 1(B).

FIG. 1(A) and FIG. 1(B) show simplified views that illustrate the first embodiment of a semiconductor device manufacturing apparatus according to the present invention, with (A) showing the condition in which the electrode terminal of the ring is removed from the surface of the substrate and (B) showing the condition in which the electrode terminal of the ring is in contact with the substrate surface.

As shown in FIGS. 1(A) and 1(B), the thermal CVD apparatus according to the present invention has a hollow vacuum chamber 1, a vacuum pump 2, such as a turbomolecular pump, for the purpose of establishing a vacuum condition inside the vacuum chamber 1, a substrate holder 3 for supporting the substrate W, this being provided within the vacuum chamber 1, an atomizer 4 that atomizes the copper to be deposited onto the substrate into the raw gas, a supply port 5 for the purpose of supplying the raw gas from the atomizer 4 to within the vacuum chamber 1, a ring 7 that has an electrode terminal unit 6 that makes contact with the surface of the substrate W, a piston cylinder apparatus 8 which moves the ring up and down, and a power supply source 9, which is electrically connected to the electrode terminal unit 6, for the purpose of changing the potential of the surface of the substrate W or supplying a current thereto, via the electrode terminal unit 6.

The substrate holder 3 has a substrate heating mechanism that can control the temperature of the substrate W within the range 100° C. and 400° C. When depositing copper, the temperature is controlled to approximately 200° C.

The ring 7 is made of an insulating material, such as alumina.

The end of the rod 8a of the piston cylinder apparatus 8 is mounted to the bottom surface of the ring 7, so that the extension and retraction of the rod 8a causes the ring 7 to rise and descend, the result of this movement being that the electrode terminal unit 6 of the ring 7 makes and breaks its contact with the surface of the substrate W.

The potential and current pattern that is supplied from the power supply source 9 is variable and can be varied so as to control the deposition of the film.

It is also possible to provide a controller 10, which monitors the potential of the surface of the substrate W, via the electrode terminal unit 6 of the ring 7, and which controls the amount of current, the potential, and the temperature of the substrate W.

In the case in which the substrate holder 3 uses an electrostatic chuck to hold the substrate W, an electrical charge is generated on the substrate W by virtue of electrostatic induction thereonto, this resulting in a change in the substrate potential, leading to the possibility of affecting the CVD reaction.

In such cases, it is preferable to use the controller 10 to control the potential of the substrate to the ground potential, for example, thereby achieving a uniform potential distribution.

By doing this, it is possible to improve the uniformity and repeatability of the film.

It is also possible to ground the surface of the substrate W or to set the substrate potential arbitrarily by using the power supply.

The vaporizer 4 vaporizes Cu (hfac) (tmvs) and hexafluoroacetyl acetonate copper trimethyl vinyl silane to serve as the raw gas for the process.

The vaporized raw gas is supplied to the surface of the substrate W via the supply port 5.

FIGS. 2(A)-2(D) are cross-sectional views that show the process steps for depositing a copper film and forming a copper wire according to the semiconductor device manufacturing method of the present invention.

First, as shown in FIG. 2(A), a trench 12 is formed in a location in which a wire will be formed on the silicon oxide film 11 of the semiconductor substrate W.

The formation of the trench 12 is done by using reactive ion etching, for example.

The width of the trench 12 can be varied, ranging from 0.3 µm to 100 µm, and is indicated in this case as being 0.5 µm.

While the depth of the trench 12 will depend on the individual design, this is indicated herein as the example of 0.5 µm.

A barrier layer 13 is formed in the trench 12 to prevent copper diffusion. The material for the barrier layer 13 can be, for example, Ta, TaN, TiN, WN, or WSIN, and the thickness thereof is approximately 10 nm.

Next, the substrate W, onto which is formed the barrier layer 13, is placed in the vacuum chamber 1 as shown in FIG. 1. The vacuum pump 2 is used to establish a vacuum within the vacuum chamber 1 beforehand.

Next, the substrate heating mechanism of the substrate holder 3 is caused to operate, so as to heat the substrate W to a prescribed temperature (of approximately 180° C.

Simultaneously with this, the Cu (hfac) (tmvs), which is the raw gas, is supplied together with hydrogen carrier gas so that, as shown in FIG. 2(B), a copper film 14 having a film thickness of 100 nm is deposited.

The pressure of the raw gas is approximately 13 Torr. When doing this, because the rod 8a of the piston cylinder mechanism 8 is extended, the electrode terminal unit 6 of the ring 7 is removed from the surface of the substrate W (refer to FIG. 1(A)).

The copper deposition reaction when the above is done is chiefly the disproportionate reaction

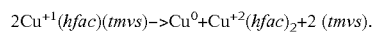

The rate of film growth is approximately 100 nm/minute.

Next, the rod 8a of the piston cylinder mechanism 8 is caused to retract, so that the electrode terminal unit 6 of the ring 7 comes into contact with the surface of the copper film 14 that was deposited on the substrate (refer to FIG. 1(B)).

A potential of −20 V from the power supply source 9, via the electrode terminal unit 6, is applied to the surface of the substrate W. By means of this potential, vapor phase Cu (hfac) is attracted.

Of the Cu (hfac), concentration of electrons and polarization occur because of the differences in electron affinity of constituent electrons thereof.

Molecules are attracted to the surface because of electrostatic attraction. At the surface of the substrate W, electron supply occurs and, in addition to the disproportionate reaction, the reduction reactions

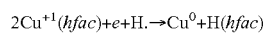

and

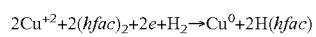

occur, so that the deposition of copper is promoted.

The hydrogen in these reactions is supplied into the vacuum chamber 1 as a carrier for the Cu (hfac) (tmvs).

The rate of deposition under these conditions is 150 nm/minute. The action of the potential causes orientation of the crystal in the direction of the electrical field.

Thus, as shown in FIG. 2(C), a copper film 15, having a film thickness of 700 nm, is deposited.

Then, as shown in FIG. 2(D), CMP (chemical mechanical polishing) is used to polish the copper films 14 and 15 and the barrier layer 13, so that the copper films 14 and 15 and the barrier layer 13 remain only within the trench 12, this forming the copper wire 16.

In this embodiment of the present invention, the first step of depositing a copper film with no current supplied is separate from a second step of depositing a copper film while supplying a current. The copper that is deposited in the first step serves as a seed layer for the purpose of supplying a uniform potential distribution.

It is also possible to cause the electrode terminal unit 6 of the ring 7 to come into contact with the barrier layer 13 from the beginning for deposit of a copper film, in which case, because the potential distribution within the substrate surface is determined by the resistance of the barrier layer 13, to achieve a uniform potential distribution, it is necessary to use a barrier layer 13 with a low resistance (such as a pure metal like Ta or Nb).

Additionally, the potential that is supplied from the power supply source 9 need not be constant and can, for example, be an alternating current which changes direction at a fixed frequency. In the case of applying an alternating current, the Cu (hfac) molecules in the vapor phase that have a polarity are attracted or repelled, or are caused to rotate by an electrical force.

By selecting an appropriate AC frequency, it is possible to control the orientation and the deposition rate.

Figure 3:
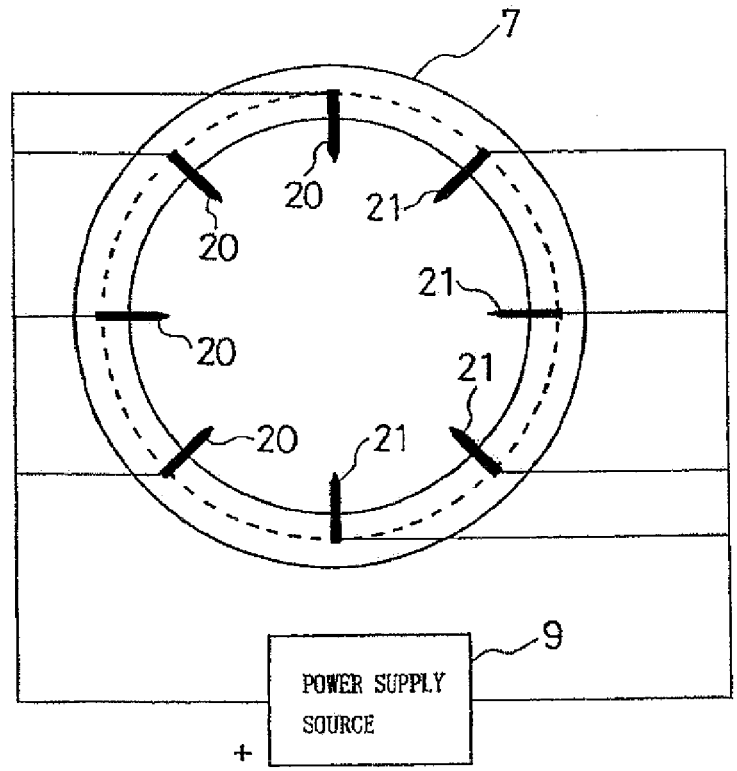
FIGS. 3(A) and 3(B) are plan views that show in simplified form a semiconductor device manufacturing apparatus according to the second embodiment of the present invention.
Figure 3:
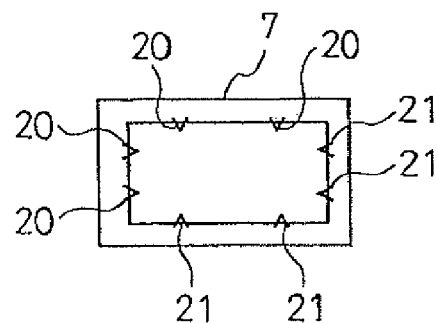

FIGS. 3(A) and 3(B) are plan views that illustrate in simplified form the second embodiment of a semiconductor manufacturing apparatus according to the present invention.

As shown in FIG. 3(A), in the second embodiment the electrode terminal that is mounted to the ring 7 is made up of four positive electrode terminals 20 and four negative electrode terminals 21, these electrode terminals being disposed in opposing manner with a prescribed interval therebetween.

The positive electrode terminals 20 and the negative electrode terminals 21 can be supplied current from the power supply source 9.

Figure 2:
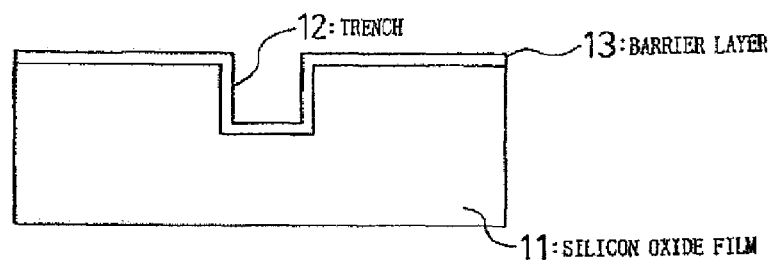
FIGS. 2(A)-2(D) are cross-sectional views of the process steps for the purpose of depositing a copper film and forming a copper wire, according to the semiconductor device manufacturing method of the present invention.
Figure 2:
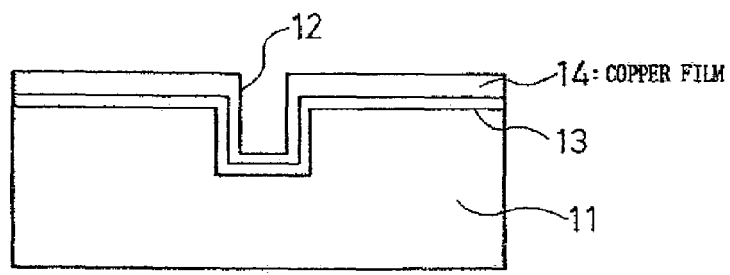
Figure 2:
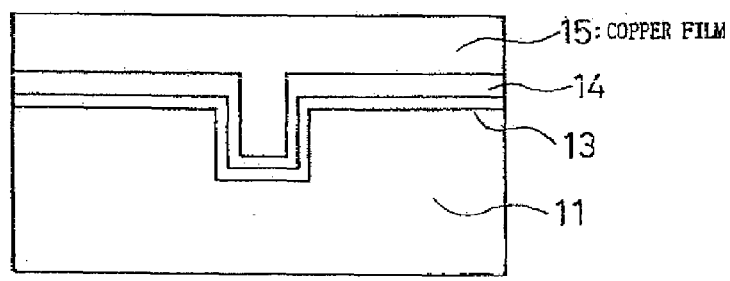
Figure 2:
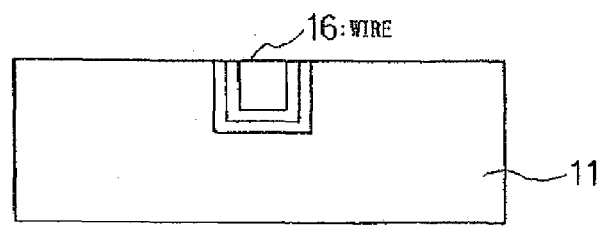

In the second embodiment of the present invention, as shown in FIG. 2 (B), a copper film 14 is deposited to a depth of 100 nm on a barrier layer 13, after which the positive electrode terminals 20 and the negative electrode terminals 21 are brought into contact with the surface of the substrate W and a current is caused to flow in the surface of the substrate W.

In this condition, Cu (hfac) (tmvs) is supplied along with hydrogen, and CVD is performed at a substrate temperature of 180° C.

In general, there is a tendency for surface atoms and molecules which are attracted to the surface to be, in comparison with atoms in the bulk material, easier to cause to migrate.

This is because of what could be called a quasi-stable condition of the deposition onto the surface and because, in contrast to the bulk material, the bonds at the surface are not as complete.

Therefore, copper atoms and Cu (hfac) that has been deposited onto the surface exhibit electromigration because of the action of the current that flows in the substrate W.

In conventional thermal deposition, thermal oscillation causes virtually random migration.

In the case in which a current is flowing in a fixed direction, however, the electrostatic action and the quantum dynamic action known as electron wind force aid the migration, enabling deposition with a given order, in accordance with the direction of current flow.

In accordance with this principle, it is possible to utilize the direction of current flow to control the orientation of the growth of the film.

The potential that is supplied from the power supply source 9 need not be constant and can, for example, be an alternating current which changes direction at a fixed frequency.

The arrangement of the positive electrode terminals 20 and the negative electrode terminals 21 is arbitrary, and can also be established so that the positive electrode terminals 20 and the negative electrode terminals 21 alternate.

The number of positive electrode terminals 20 and the negative electrode terminals 21 is also arbitrary.

Additionally, it is possible to provide a controller 10 such as described with regard to the first embodiment.

FIG. 3(B) shows another feature of this embodiment in that the electrode terminal units supporting means 7 has a rectangular configuration instead of circular configuration as shown in FIG. 3(A).

Note that, a controlling mechanism of this feature as shown in FIG. 3(B) is substantially identical to that as shown in FIG. 3(A).

Figure 4:
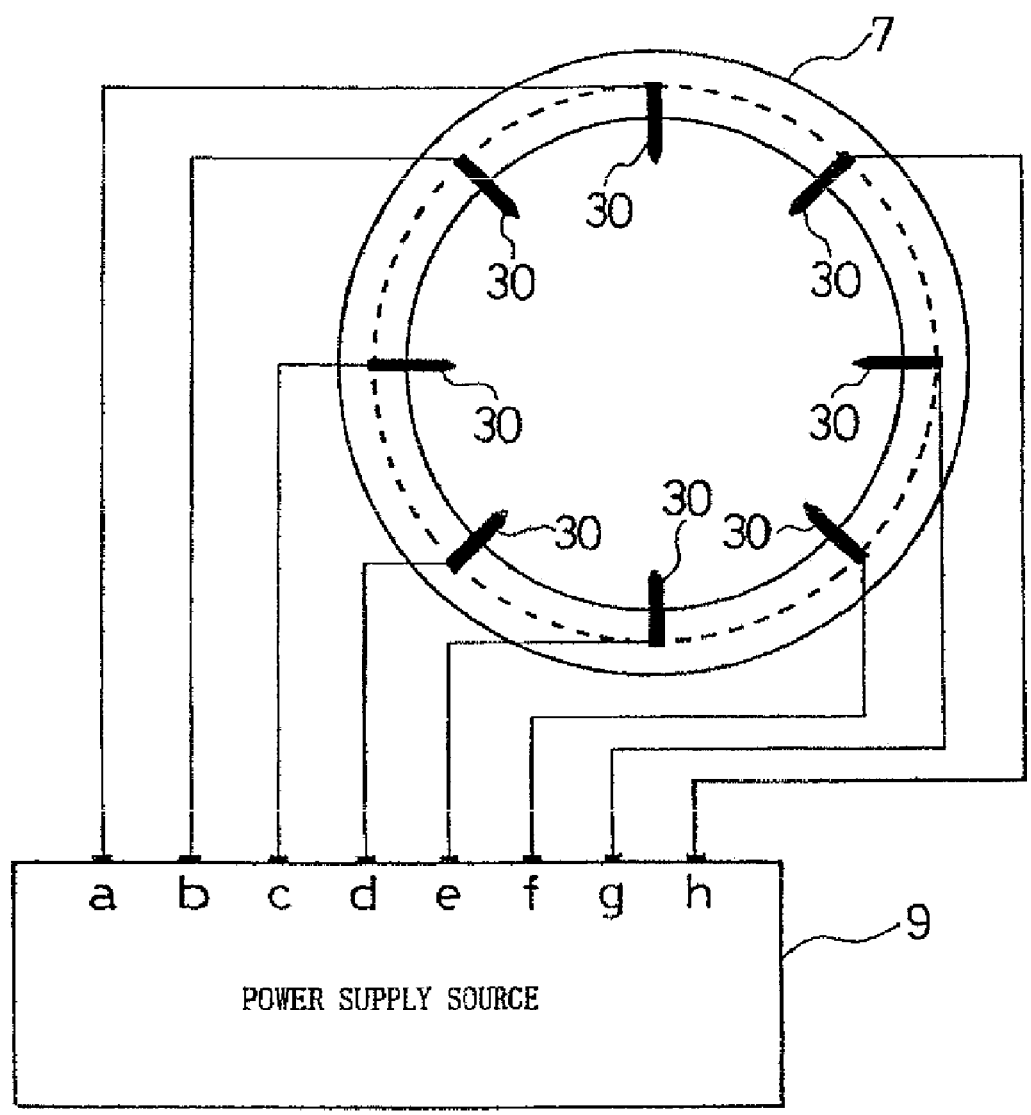
FIG. 4 is a plan view that shows in simplified form a semiconductor device manufacturing apparatus according to the third embodiment of the present invention.

FIG. 4 is a plan view that shows in simplified form the third embodiment of a semiconductor device manufacturing method according to the present invention.

As shown in FIG. 4, in the third embodiment there are eight electrode terminal units 30 arranged concentrically about the ring 7 at a uniform interval.

Each of the electrode terminal units 30 is connected independently to the power supply terminals a through h of the power supply source 9, and has a voltage applied to it independently.

For example, if a positive voltage is applied in the sequence a→b→c→d, and simultaneously a negative voltage is applied in the sequence e→f→g→h, the direction of current flow between the electrode terminal units 30 will rotate with a fixed period.

By doing this, an averaged current will flow within the surface of the substrate, so that surface atoms and attracted molecules are encouraged to migrate by the current, which is parallel to the substrate surface, this resulting in an imparted directionality, so that a controlled film is deposited by the action of the current.

More specifically, the migration encourages the diffusion of atoms at the crystal grain boundaries and encourages grain growth, this having effects such as achieving large crystal grains. With large crystal grains, because the grain boundaries are small, immunity to electromigration when wiring is formed results in the formation of highly reliable wires.

Additionally, a film resulting from grain growth having directionality that is imparted by a current that is parallel to the substrate surface is in a stable energy state under this current stress.

Current flowing after the formation of the wires also flows in parallel to the substrate surface, in the same plane as current stress during the growth of the film.

As described above, the film is deposited in a manner so that it is in the most energy stable condition under current stress, and is in an energy stable condition even when current is flowing in the wiring. Because of this, it is possible to achieve a film that is immune to current stress.

The potential that is supplied from the power supply source 9 need not be constant and can, for example, be an alternating current which changes direction at a fixed frequency.

The number and arrangement of the electrode terminal units 30 are also arbitrary and, as noted for the first embodiment, it is possible to provide a current controller 10.

Figure 5:
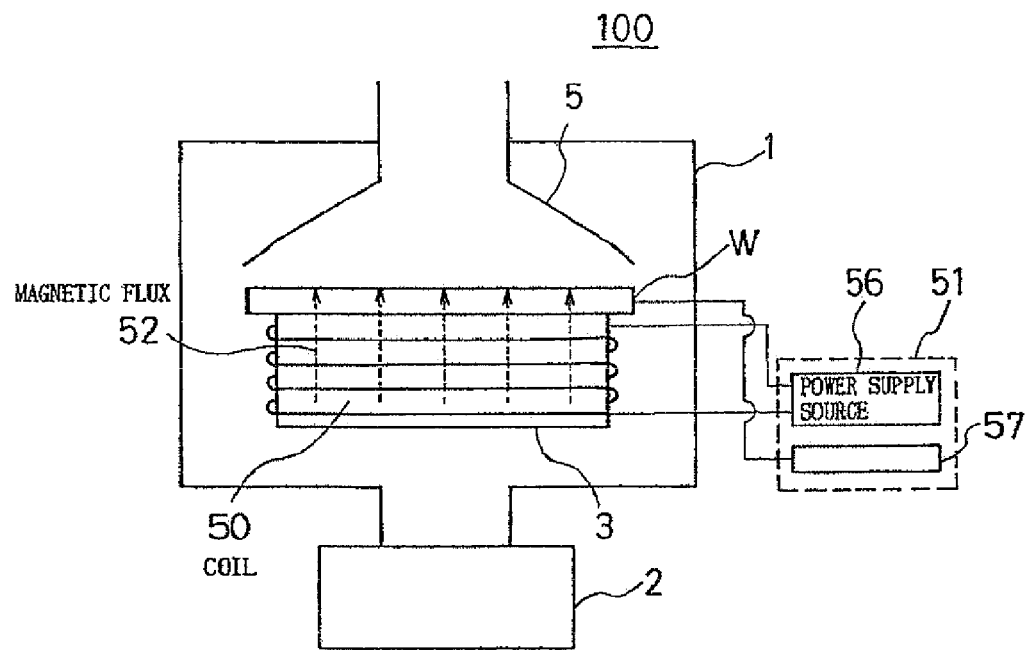
FIG. 5 (A) and (B) are drawings that show in simplified form a semiconductor device manufacturing apparatus according to the fourth embodiment of the present invention.
Figure 5:
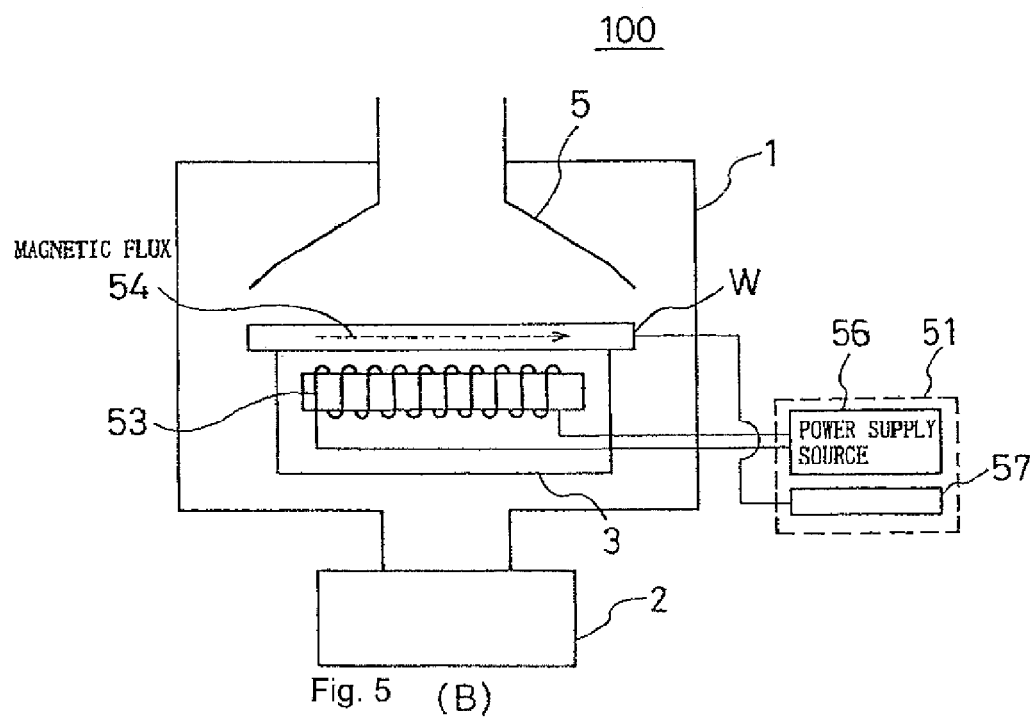

FIGS. 5(A) and (B) are drawings that illustrate in simplified form the fourth embodiment of a semiconductor device manufacturing method according to the present invention.

Whereas in the first through third embodiments of the present invention an electrode terminal makes contact with the substrate W or with a film that is deposited thereupon, this being the means for applying either current or a potential, in the fourth embodiment a current or a potential is applied by a method that does not require contact with the substrate W or with a film that is deposited thereupon.

Specifically, for example, as shown in FIG. 5(A), a coil 50, is provided that is wound in a direction that is parallel to the substrate holder 3, a current being caused to flow in the coil 50 by a power supply 51, thereby applying magnetic flux 52 in a direction that is perpendicular to the substrate W.

By doing this, an eddy current is developed within the surface of the substrate W, thereby encouraging the deposition of the film.

By controlling the magnetic flux to be applied, it is possible to control the rate of film deposition, the crystal orientation, and grain growth.

As shown in FIG. 5(B), by providing a coil 53 that is wound in a direction that is perpendicular to the substrate holder 3, a current is caused to flow in the coil 53 by the power supply 51, thereby applying magnetic flux 54 in a direction that is perpendicular to the substrate W.

According to the fourth embodiment of the present invention, because there is no need for a mechanism to move a ring having electrode terminals, the hardware is simplified and made smaller.

Also, because there is no need to consider such things as the contact condition between the electrode terminals and the substrate W, it is possible to achieve reliable application of either a current or a potential.

As mentioned above, the fourth embodiment of the present invention has a characteristic feature such that the power supply means 51 comprises a power supply source 56 and a non-contact electric current supplying means 50 which is connected to the power supply source means 56 and supplying the current to the substrate W or the film F deposited thereupon, without making the current supplying means to be directly connected thereto.

More specifically, the semiconductor device manufacturing apparatus 100 of this embodiment, has the non-contact electric current applying means 50 comprises a coil means.

Note that, the power supply means 51 may further comprise a current controlling means 57 which controls value of the current to be applied to the coil 50 or 53, so as to control an current flowed through the substrate W or the film F deposited thereupon.

The present invention is not restricted to the above-described embodiments, and can be the subject of variations which fall within the technical scope as set forth in the claims for the present invention.

The present invention can be applied not only to a copper film, but also to deposition of metal films such as Al, Au, Ag, Ti, and Ni, and of insulation films such as Parylene having polarity.

The present invention can also be applied to the formation of films that have a polarity, such as strong dielectric films of strontium titanate, titanium oxide barium, BST, lead titanate, and the like, in which case the deposited film is oriented in the direction of the electrical field, resulting in deposition of a film with uniform polarity.

The fifth embodiment of the present invention will be explained hereunder.

Note that the fifth embodiment of the present invention is a method for manufacturing a semiconductor device utilizing the thermal CVD reaction.

Figure 6:
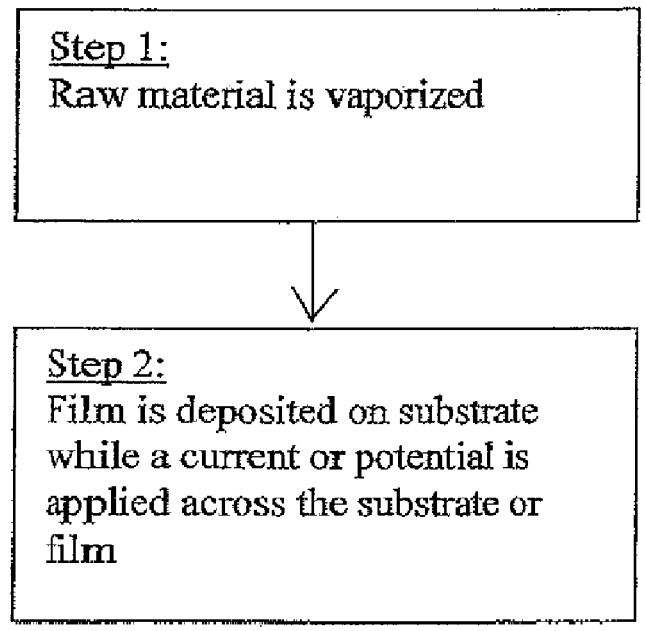
FIG. 6 is a flow chart that demonstrates a method of depositing a film onto a substrate while a current or potential is applied across the substrate or film, in accordance with one aspect of the present invention.

As explained hereabove, and shown in FIG. 6, a semiconductor device manufacturing method for depositing a film on a substrate by a thermal CVD reaction of the present invention has a basic technical conception in that a film is deposited on a substrate while a current is applied to the substrate or film deposited thereupon.

In the semiconductor device manufacturing method of the present invention, the film is deposited while the potential on the substrate or film deposited thereupon is arbitrarily set.

Further in the present invention, the film is deposited while the electric current is applied to the substrate or the film deposited thereupon, intermittently.

Figure 7:
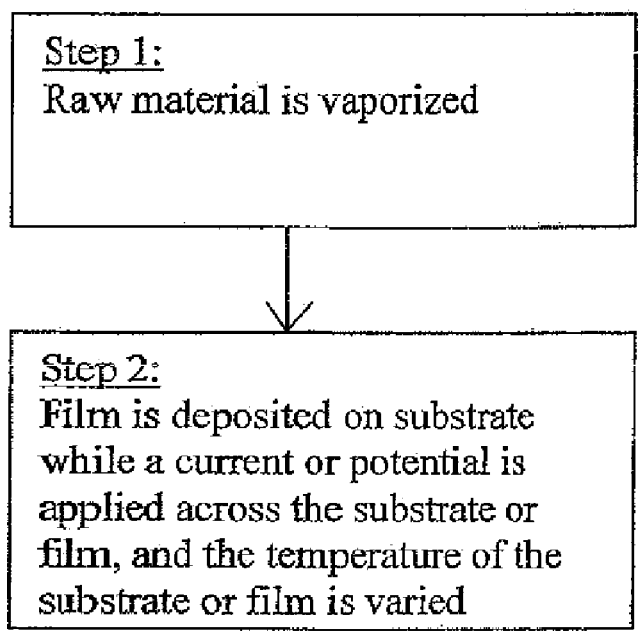
FIG 7. is a flow chart that demonstrates a method of depositing a film onto a substrate while a current or potential is applied across the substrate or film, and the temperature of the substrate or film is varied, in accordance with another aspect of the present invention.

On the other hand, the film may also be deposited on the substrate while either one of the voltage value and the current value is varied either intermittently or continuously, as shown in FIG. 7.

In the present invention, the film may further be deposited while a direction of the current flowed through the substrate or the film deposited thereupon, is changed, either intermittently or continuously.

In another aspect of the present invention, the film may be deposited while a temperature of the substrate or of the film deposited thereupon, is varied as well as either one of the voltage value and the current value can be varied either intermittently or continuously.

Figure 8:
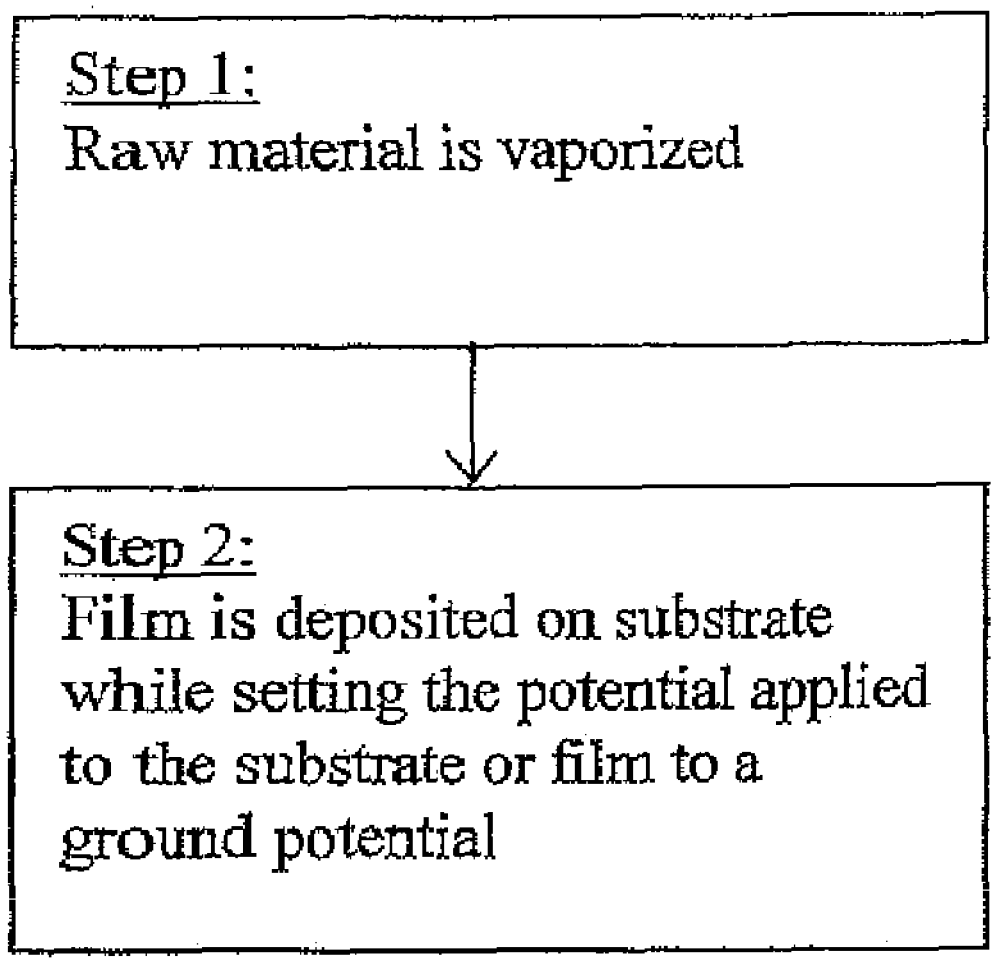
FIG. 8 is a flow chart that demonstrates a method of depositing a film onto a substrate while setting the potential applied to the substrate or film to a ground potential, in accordance with yet another aspect of the present invention.
Figure 9:
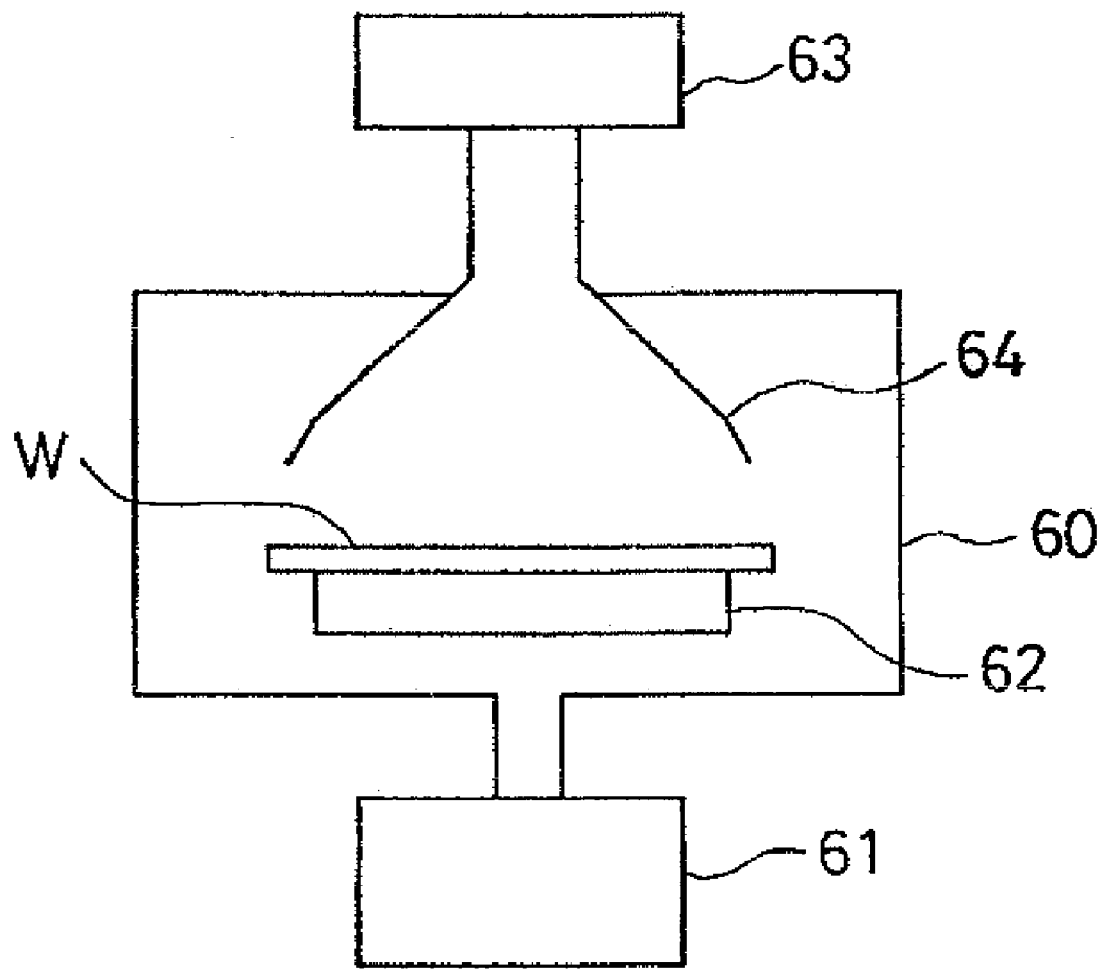
FIG. 9 shows one of a typical conventional thermal CVD apparatus.

In a further aspect of the present invention, the film is deposited on the substrate while selling the potential of the substrate or film deposited thereupon to a ground potential, as shown in FIG. 8.

In a separate aspect of the present invention, a current or a potential is applied to the substrate or film deposited thereupon without making direct contact with the substrate or film deposited thereupon and more specifically, magnetic flux can be applied to the substrate or film deposited thereupon.

In one of the basic semiconductor device manufacturing methods of the present invention, the method comprises, a step of depositing a film onto a substrate using a thermal CVD reaction and a step of depositing a film by using a thermal CVD reaction as a current is applied to either one of the substrate and the deposited film.

In more specific method of the present invention, it comprises, a step of forming a trench on a semiconductor substrate, a step of depositing a barrier layer for the purpose of preventing film diffusion within the trench, a step of depositing a film onto the barrier layer by using a thermal CVD reaction, a step of depositing a film by using a thermal CVD reaction while applying either one of a current and a voltage to either one of the substrate and the deposited film, and a step of polishing the film and the barrier layer, so as to leave the film and barrier layer within the trench, so as to form a wire.

According to the present invention, by applying a current or a potential to a substrate or to a film that is deposited onto the substrate, in addition to a disproportionate reaction, a reduction reaction occurs, thereby encouraging the deposition of the film.

As a result, the time required for manufacture of the semiconductor device is shortened, and the productivity is improved.

Because the present invention enables control of the crystal orientation in the deposited film, it enables deposition of a film with high quality and uniform polarity.

Because the present invention enables control of the film grain growth, it improves the reliability of wires.

Additionally, because the present invention enables the potential of the substrate or the film deposited thereupon to be set to the ground potential, it enables the achievement of a uniform potential distribution over the surface of the substrate, which can normally be disturbed by, for example, electrostatic chucking, thereby improving the uniformity and repeatability of the deposited film.

What is claimed is:

1. A semiconductor device manufacturing method for depositing a film on a substrate by a thermal CVD reaction, wherein a raw material is vaporized to form a vapor phase deposition material, and said film is deposited on said substrate while a d.c. electrical potential is applied across said substrate or film deposited thereupon, thereby orienting precursor molecules of said vapor phase material in the direction of the electrical field induced by said d.c. electrical potential.

2. A semiconductor device manufacturing method according to claim 1, wherein said film is deposited while the d.c. electrical potential on said substrate or film deposited thereupon is arbitrarily set.

3. A semiconductor device manufacturing method according to claim 1, wherein said film is deposited while the d.c. electric potential is applied to said substrate or said film deposited thereupon, intermittently.

4. A semiconductor device manufacturing method according to claim 1, wherein said film is deposited while said d.c. electrical potential is varied either intermittently or continuously.

5. A semiconductor device manufacturing method according to claim 1, wherein said film is deposited while a direction of said d.c. electrical potential applied to said substrate or said film deposited thereupon, is changed, either intermittently or continuously.

6. A semiconductor device manufacturing method according to claim 1, wherein said film is deposited while a temperature of said substrate or of said film deposited thereupon, is varied.

7. A semiconductor device manufacturing method according to claim 1, wherein either one of a voltage value or a potential value is varied either intermittently or continuously.

8. A semiconductor device manufacturing method according to claim 1, wherein said film is deposited while setting the potential of said substrate or film deposited thereupon to a ground potential.

9. A semiconductor device manufacturing method that uses a thermal CVD reaction to deposit a film onto a substrate, said method comprising:

vaporizing a raw material to form a vapor phase deposition material; and depositing a film by using a thermal CVD reaction by applying a d.c. electrical potential across either one of said substrate and said film deposited thereon, thereby orienting precursor molecules of said vapor phase material in the direction of the electrical field induced by said d.c. electrical potential.

* * * * *